(12) United States Patent
Mayer et al.

(10) Patent No.: US 7,515,456 B2
(45) Date of Patent: Apr. 7, 2009

(54) MEMORY CIRCUIT, A DYNAMIC RANDOM ACCESS MEMORY, A SYSTEM COMPRISING A MEMORY AND A FLOATING POINT UNIT AND A METHOD FOR STORING DIGITAL DATA

(75) Inventors: Peter Mayer, Neubiberg (DE); Wolfgang Spirkl, Germering (DE); Markus Balb, Munich (DE); Christoph Bilger, Munich (DE); Martin Brox, Munich (DE); Thomas Hein, Munich (DE); Michael Richter, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/530,858

(22) Filed: Sep. 11, 2006

(65) Prior Publication Data

US 2008/0062743 A1  Mar. 13, 2008

(51) Int. Cl.
*G11C 11/00* (2006.01)

(52) U.S. Cl. .................................. 365/149; 365/189.05

(58) Field of Classification Search ................. 365/149, 365/189.05
See application file for complete search history.

(56) References Cited

U.S. PATENT DOCUMENTS

| | | | | |
|---|---|---|---|---|
| 5,956,047 A * | 9/1999 | Krech et al. | ................. | 345/503 |
| 5,969,986 A * | 10/1999 | Wong et al. | ............ | 365/185.03 |
| 6,219,071 B1 * | 4/2001 | Krech et al. | ................. | 345/503 |
| 6,389,149 B1 | 5/2002 | Liu | | |
| 6,538,593 B2 * | 3/2003 | Yang et al. | ................... | 341/155 |
| 6,647,486 B2 | 11/2003 | Ohba | | |
| 6,954,204 B2 * | 10/2005 | Zatz et al. | .................... | 345/522 |
| 6,999,098 B2 | 2/2006 | Leather | | |
| 7,057,649 B2 * | 6/2006 | Caci | ......................... | 348/231.6 |
| 2002/0027606 A1 * | 3/2002 | Yadid-Pecht | ................ | 348/298 |
| 2003/0029989 A1 * | 2/2003 | Stettner et al. | ........... | 250/208.1 |
| 2007/0033152 A1 * | 2/2007 | Hahn et al. | ................. | 705/500 |
| 2007/0089125 A1 * | 4/2007 | Claassen | ........................ | 725/9 |
| 2007/0217258 A1 * | 9/2007 | Wang | .................... | 365/185.03 |

FOREIGN PATENT DOCUMENTS

DE      19882925 T1    12/2002

* cited by examiner

*Primary Examiner*—Michael T Tran
(74) *Attorney, Agent, or Firm*—Patterson & Sheridan, L.L.P.

(57) ABSTRACT

A memory circuit comprises a D/A converter connected with an input/output circuit and with a writing circuit, wherein the D/A converter converts a digital data with at least two digital bits received from the input/output circuit to one analog value and forwards the analog value to the writing circuit, wherein the digital data is at least a part of a floating point number, wherein the writing circuit writes the analog value in at least one selected memory cell, and an A/D converter connected with a reading circuit and with the input/output circuit, wherein the reading circuit reads an analog value from a selected memory cell and forwards the analog value to the A/D converter, wherein the A/D converter converts the analog value to digital data, and wherein the A/D converter forwards the digital data to the input/output circuit. Furthermore, a method is provided for reading data from at least one memory cell of a memory, wherein an analog value is read from the memory cell and the analog value is corrected according to a correction factor representing a storage time the analog value was stored and wherein the corrected analog value is converted to digital data.

27 Claims, 4 Drawing Sheets

FLOATING POINT

FIG 8

MEMORY CIRCUIT, A DYNAMIC RANDOM ACCESS MEMORY, A SYSTEM COMPRISING A MEMORY AND A FLOATING POINT UNIT AND A METHOD FOR STORING DIGITAL DATA

BACKGROUND OF THE INVENTION

1. Field of the Invention

Embodiments of the present invention provide a memory circuit with memory cells, a dynamic random access memory circuit with memory cells, a system comprising a memory and a floating point unit and a method for storing digital data in a memory with memory cells.

2. Description of the Related Art

Memory circuits, for example, dynamic random access memories (DRAMs) store data as digital data in memory cells. The digital data are stored bit by bit in single memory cells. The digital data may be stored in a memory cell comprising a capacitor as a high or a low voltage level representing the digital data 1 or the digital data 0.

Many implementations, such as calculating three dimensional images for displaying pictures, need a lot of calculations because, for every pixel of a picture, the color of the pixel has to be calculated depending on the movement within the picture and stored in the memory. Therefore, a large memory capacity is needed, particularly for technologies used in video applications and in video computer games.

What is needed is an improved memory and an improved method for storing data in a memory with a reduced need for storage capacity.

SUMMARY OF THE INVENTION

Embodiments of the present invention provide an improved memory circuit, an improved dynamic random access memory circuit, an improved system comprising a memory and a floating point unit and an improved method for storing digital data in a memory.

A first embodiment of the invention provides a memory circuit comprising a memory controller having an input/output circuit connected to a memory array with memory cells, an address circuit that selects at least one of the memory cells for a reading or a writing operation, a reading and a writing circuit that are connected with the input/output circuit, wherein the writing circuit stores digital data in the selected memory cell and the reading circuit reads digital data from the selected memory cell, a D/A converter that is connected with the input/output circuit and with the writing circuit, wherein the D/A converter converts a digital data with at least two digital bits received from the input/output circuit to one analog value and forwards the analog value to the writing circuit, wherein the digital data is at least a part of a floating point number, wherein the writing circuit writes the analog value in one at least selected memory cell, and an A/D converter that is connected with the reading circuit and with the input/output circuit, wherein the reading circuit reads an analog value from a selected memory cell and forwards the analog value to the A/D converter, wherein the A/D converter converts the analog value to digital data with at least two digital bits, and wherein the A/D converter forwards the digital data to the input/output circuit.

A further embodiment of the invention provides a dynamic random access memory circuit comprising a memory controller having an input/output circuit connected to a memory array with memory cells, an address circuit that selects at least one of the memory cells, a reading and a writing circuit that are connected with the input/output circuit, wherein the writing circuit stores digital data in the selected memory cell and the reading circuit reads data from the selected memory cell, a D/A converter that is connected with the input/output circuit with the writing circuit, wherein the D/A converter converts a digital data with at least two digital bits received from the input/output to one analog value and forwards the analog value to the writing circuit, wherein the digital data represent at least a part of a floating point number, wherein the writing circuit writes the analog value in at least one selected memory cell, and an A/D converter that is connected with the reading circuit and with the input/output circuit, wherein the reading circuit reads an analog value from a selected memory cell and forwards the analog value to the A/D converter, and wherein the A/D converter converts the analog value to digital data with at least two digital bits, wherein the A/D converter forwards the digital data to the input/output circuit.

Another embodiment of the present invention provides a memory with memory cells comprising an address circuit that selects a memory cell, a writing and a reading circuit, wherein the writing circuit receives digital data from an input/output circuit and writes one digital bit of the digital data in a selected memory cell, wherein the reading circuit reads a digital bit from a selected memory cell and forwards the digital bit to the input/output circuit, wherein the digital data represents at least a part of a floating point number, an A/D converter that converts the digital data with at least two digital bits to an analog value, wherein the writing circuit writes the analog value in one selected memory cell, wherein the reading circuit reads an analog value from one selected memory cell and the A/D converter converts the analog value from the reading circuit to an digital data with at least two digital bits that are forwarded to the input/output, wherein the reading circuit comprises a voltage sensing circuit for sensing the voltage level of the memory cell that represents an analog value for at least a part of a floating point number, wherein the memory comprises a processing circuit that processes the sensed voltage to a corrected voltage level depending on a time period during which the analog data was stored.

A further embodiment of the invention provides a method for storing at least a part of a floating point number which comprises digital data with at least two digital bits in a memory and reading digital data with at least two digital bits from the memory, wherein the digital data are converted to an analog value and the analog value is stored in at least one memory cell.

Another embodiment of the invention provides a method for reading data from at least one memory cell of a memory wherein an analog value is read from the memory cell and the analog value is corrected according to a correction factor representing a storage time the analog value was stored and wherein the corrected analog value is converted to digital data.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

A more complete understanding of the present invention may be derived by referring to the detailed description and claims, considering in connection with the Figures, wherein like reference numbers refer to similar elements throughout the Figures, and:

DETAILED DESCRIPTION OF THE PREFERRED EMBODIMENT

Figure 1:
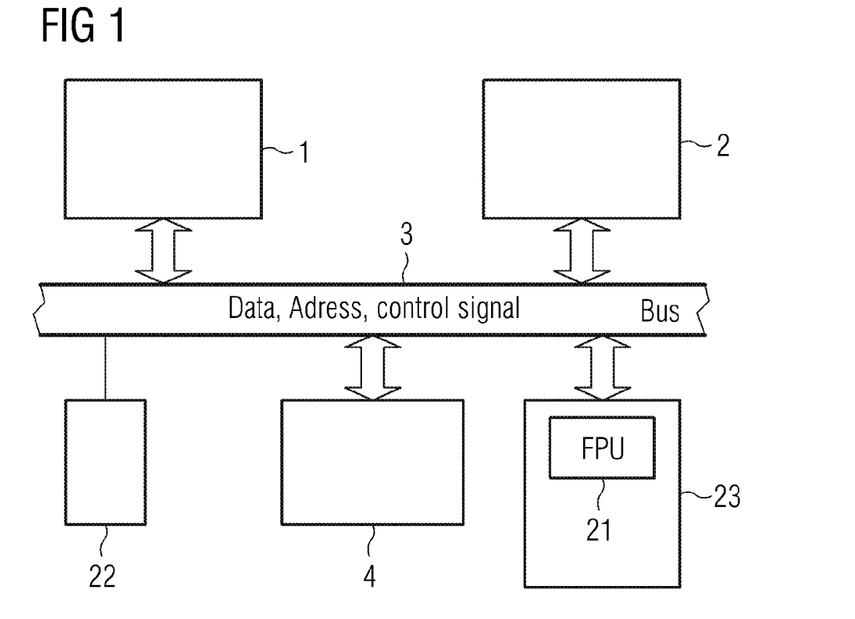
FIG. 1 depicts a schematic view of a system with a memory and a controlling processing unit.

FIG. 1 depicts a schematic view of a system comprising a memory circuit 2 and a controlling processing unit (CPU) 1 that are connected by a bus 3. Additionally, an input/output (I/O) unit 4 is connected with the bus 3. The CPU 1 may comprise a general controlling processing unit or a floating point processing unit. The memory circuit 2 may comprise a memory such as a DRAM, a flash memory, or any other kind of memory circuit that comprises a memory element for storing digital data with at least two digital bits with one analog stored signal. The bus 3 comprises, for example, data lines, address lines and control lines for exchanging data, addresses and control commands between the CPU 1, the memory circuit 2 and/or the I/O unit 4. Instead of a bus 3, other lines may be utilized for exchanging data, addresses and control commands. The I/O unit 4 is configured to send data to the CPU 1 and/or the memory 2 and to receive output data from the memory circuit 2 and/or the CPU 1.

Depending on the embodiment, there may be a general CPU 1 and a further Floating Processing Unit (FPU) 21 that is connected with the bus 3. The invention may be applied in a graphic processing system generating pixel information for a display 22 that may also be connected with the bus or may be connected directly with the CPU 1. The display 22 may comprise a display controller that converts the digital data of the pixel information to analog signals for displaying a screen on the display 22. The CPU 1 may utilize a software program for processing graphics information by using the floating processing unit 21 and the memory circuit 2 for displaying the graphic information on the display 22. The floating processing unit 21 generates floating point pixel information in response to the graphics data received from the CPU 1. The floating point pixel information is delivered by the FPU 21 to the memory circuit 2.

The graphic information may comprise a brightness value for controlling the brightness of the display 22. The brightness value may be stored in the memory circuit 2 and provided to the FPU 21 for calculating a compensated brightness value that is adapted to the brightness characteristic of the display 22. The FPU calculates from the input value delivered by the memory circuit 2 an output pixel appearance and an accurate presentation of pixel information for the display 22. The FPU unit 21 may be part of a processing circuit 23 that includes, among other things, a circuit for restoring, a shading circuitry and a blending circuitry that perform floating point operations on the incoming data information of the memory circuit 2.

The pixel information may be used for calculating a three-dimensional picture, for example, for a video game. The floating point pixel information is provided to the memory circuit 2 and stored in the memory circuit 2. Additionally, fixed point pixel information may be generated by the processing circuit 23 based on the floating point pixel information and stored in the memory circuit 2. The floating point pixel information may represent a 32 bit floating value, including one sign bit, an exponent with six bits and a mantissa with 24 bits. The mantissa may represent a value between 0 and 1.

Figure 2:
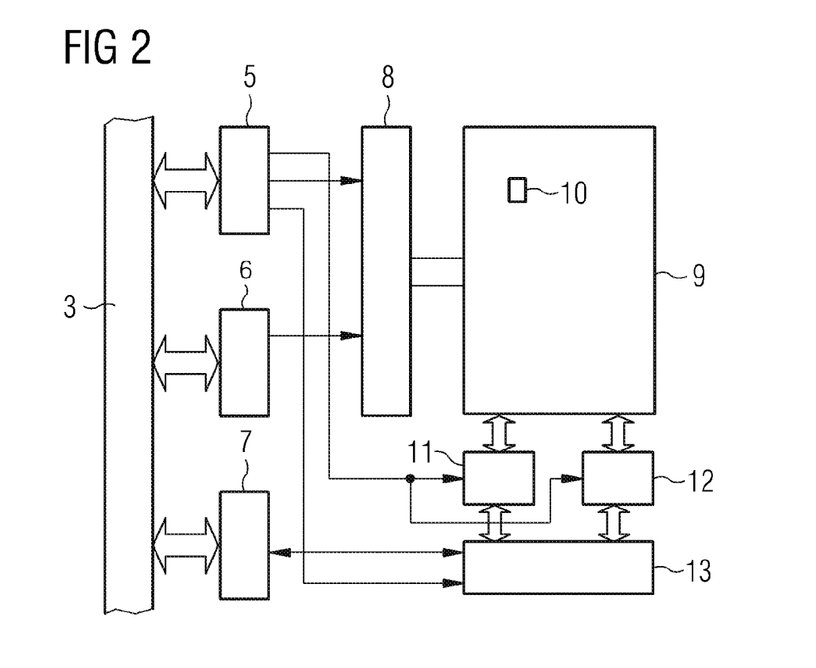
FIG. 2 depicts a schematic view of a first embodiment of a memory circuit.

FIG. 2 depicts a further embodiment of a memory circuit 2 comprising a control circuit 5, an address circuit 6, a data I/O circuit 7 that may be connected with the bus 3. Furthermore, the memory circuit 2 comprises a cell array 9 comprising memory cells 10 that may be selected individually by a select circuit 8. The select circuit 8 may access each of the memory cells 10. The control circuit 5 and the address circuit 6 are connected with the select circuit 8. Additionally, the control circuit 5 is connected with a first write/read circuit 11 and a second write/read circuit 12. Additionally, the control circuit 5 is connected with an I/O register 13. The data I/O circuit 7 is also connected with the I/O register 13. The I/O register 13 is connected with the first and the second write/read circuit 11, 12. Additionally, the first and second write/read circuit 11, 12 are connected with the memory cells 10 of the cell array 9. Depending on the embodiment, the first and the second write/read circuit 11, 12 may be connected with the same memory cells 10 of the cell array 9, or the first write/read circuit 11 may be connected with the memory cells 10 of a first predetermined part of the cell array 9 and the second write/read circuit 12 may be connected with the memory cells 10 of a second predetermined part of the cell array 9.

The CPU 1 or the processing circuit 23 may control storing or reading data in the memory circuit 2. A control command is delivered by the bus 3 to the control circuit 5, and an address of the memory cell 10 is delivered to the address circuit 6, in which memory cells 10 data should be stored or from which memory cells 10 data should be read. Furthermore, the data that should be stored is delivered by the bus 3 to the data I/O circuit 7. The data are digital data represented by one or several digits that are represented by a high or a low voltage signal level constituting a logical 0 or a logical 1. Each of the digital bit representing an 0 or a 1 may be stored in one memory cell 10 of the cell array 9. If a data word comprising 32 bits is stored, then the data word with the 32 bits is sent to the data I/O circuit 7. Additionally, the addresses of the memory cells in which the data word should be stored are provided to the address circuit 6, and a control command is delivered to the control circuit 5 with the command to store the data word at the provided addresses.

The addresses of the memory cells are delivered from the address circuit 6 to the select circuit 8. Furthermore, the control circuit 5 sends the command to store the data word at the delivered addresses to the select circuit 8. The select circuit 8 selects, based on the delivered addresses, the memory cells 10 of the cell array 9 for storing data.

Furthermore, the first or the second write/read circuit 11, 12 receives a control command from the control circuit 5 that the data word that is put in the I/O register 13 is to be stored in the selected memory cells 10. The data I/O circuit 7 delivers the received data word to the I/O register 13 that comprises in this embodiment 32 digital bits.

For data word to be stored in the conventional method, the first write/read circuit 11 receives the command signal to store the data word of the I/O register 13 to the selected 32 memory cells 10 of the cell array 9. The first write/read circuit 11 stores the 32 bits of the data word in the selected 32 memory cells 10. Depending on the embodiment of the memory cells 10, the first write/read circuit 11 comprises a circuit for charging a capacity of a capacitor of the memory cell or for changing a resistive value of the memory cell if it comprises a resistive element as a memory element.

For data word with the 32 data bits to be stored at least partly as an analog value, the control circuit 5 receives a corresponding control command by the bus 3. Furthermore, the address circuit 6 receives the addresses of the memory cells or the memory cell at which the data word should be stored. The data I/O circuit 7 receives the data word and transmits the data word to the I/O register 13.

In one embodiment, if the whole data word with the 32 data bits may be stored in only one memory cell 10, then the address circuit 6 receives only one address of one memory cell 10 and transmits this one address to the select circuit 8. The control circuit 5 delivers a control command to the select circuit 8 to select the memory cell with the address that is delivered by the address circuit 6 to the select circuit 8 for storing data in the memory cell. Additionally, the control circuit 5 sends a store command to the second write/read circuit 12 to store the data word that is in the I/O register 13 in the selected memory cell or the selected memory cells 10.

Figure 3:
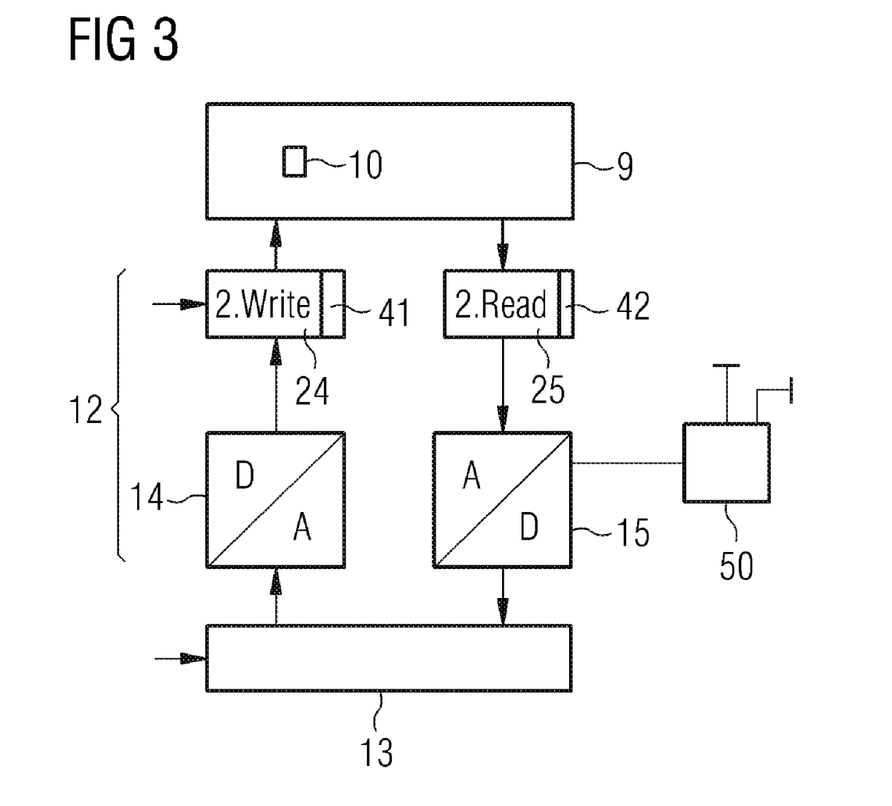
FIG. 3 depicts a greater detail of a part of the first embodiment of the memory circuit.

The second write/read circuit 12 is depicted in a greater detail in FIG. 3, comprising a digital-to-analog (D/A) converter 14 that is connected via an input with the I/O register 13 and connected via an output with a second write circuit 24. The second write circuit 24 is connected to the memory cells that are selected by the select circuit 8. Furthermore, the second write/read circuit 12 comprises a second read circuit 25 that is connected via an input with the memory cells of the cell array 9 and via an output with an analog-to-digital (A/D) converter 15. The output of the analog-to-digital converter 15 is connected with the I/O register 13. Furthermore the A/D converter 15 is connected with a processing circuit 50. The processing circuit 50 is connected with the select circuit 8 and receives the information at which time point data are written in the memory cells.

If there is only one memory cell 10 selected in which the whole digital data comprising for example 32 data bits should be stored, then the 32 data bits are converted by the D/A converter 14 to one analog value that is stored by the second write circuit 24 in the selected one memory cell 10 of the cell array 9. The digital/analog converter 14 comprises a reference table that determines to which analog value the digital data word is converted representing with this one analog value the digital data word.

Thus, using the second write/read circuit 12 it is possible to store a digital data word comprising at least two digital bits in one memory cell 10 using one analog signal in which the at least two digital data bits are converted by the digital-to-analog converter 14.

For a data word comprising 32 data bits which is read from one memory cell 10, the control circuit 5 receives the control command to read a data word from a memory cell, and the address circuit 6 receives the address of the one memory cell. The control circuit 5 sends the control command to the select circuit 8 to select one memory cell 10. Additionally, the address circuit 6 sends the address of the memory cells 10 from which data should be read to the select circuit 8. The select circuit 8 delivers the address of the memory cell from which data should be read to the processing circuit 50.

In this example, the select circuit 8 receives only the address of one memory cell 10 from which data should be read. Furthermore, the control circuit 5 sends a control command to the second write/read circuit 12 to read an analog value from at least one selected memory cell 10. The control command is received by the second read circuit 25 that reads from the selected memory cell 10 the stored analog value and transmits the analog value to the A/D converter 15.

The A/D converter 15 is connected with a processing circuit 50. The processing circuit 50 generates the information regarding how long the read data was stored in the memory cell. Depending on the storage time, the processing circuit 50 determines according to a predetermined time table a correction factor. The processing circuit 50 evaluates the read analog value with the correction factor and generates a corrected analog value. In a further embodiment, the correction factor may be predetermined and based on an average storage time. In a further embodiment, the processing circuit 50 calculates the storage time using the information of the select circuit 8 at which time the data was stored in the memory cell and at which time the data is read from the memory by the second read circuit 25.

Basically, the correction factor is used for compensating a time dependent process that changes the analog value of the data that is stored in the memory cell and read. If a capacitor is used, a leakage current exists that reduces the amount of charge that is stored representing the analog data. The processing circuit 50 may increase the value of the read analog signal proportional to the storage time of the analog data.

The processing circuit 50 converts the corrected analog data to at least two data bits according to a converting table and sends the data bits to the I/O register 13. The I/O register 13 sends the data bits to the data I/O circuit 7. The data I/O circuit 7 receives the data bits and transmits the data bits over the bus 3 to the requesting unit, for example, the CPU 1 or the processing circuit 23. The A/D converter 15 may also convert, in a further embodiment, the analog value to a data word with for example 32 data bits. The data word is transferred by the I/O register 13 and the data I/O circuit 7 to the bus 3.

Depending on the embodiment, the memory circuit 2 as disposed in FIG. 2 may have only a second write/read circuit 12 and no first write/read circuit 11. This means that all digital data are stored as analog values in the memory cells 10. Depending on the embodiment, the digital/analog converter 14 and the analog/digital converter 15 may comprise an input and an output with a bandwidth that is controllable. Thus, it may be possible to read and write data words with different numbers of digital bits in one memory cell 10.

In further embodiments, several second write/read circuits 12 may be provided with the I/O register 13 or with several I/O registers 13. Using several second write/read circuits 12 allows for storing a data word with several digital data bits as analog data in at least two memory cells 10 in one operation. Therefore, it is not necessary to store each data word in precisely one memory cell, but rather, it is possible to store a data word in at least two memory cells as analog values.

Using this embodiment, it is possible to adjust the number of memory cells for storing one data word depending on the importance of the necessary preciseness of the stored data. Therefore, it might be useful to select only one memory cell for storing a data word with one analog value if the data word has a lower importance and to select at least two memory cells for storing a data word with two analog values in two memory cells if the data word is more important.

Depending on the embodiment, there may be only one second write/read circuit 12 that stores a data word in two analog values in two memory cells. The second write/read circuit may first convert the half of the data bits of the data word to one analog value and then store this analog value to a first selected memory cell. Then the second write/read circuit 12 converts the second part of the digital bits of the data word to a second analog value and stores the second analog value in a second memory cell as an analog data.

For reading out a data word that is stored in two different memory cells as two analog values, the second write/read circuit 12 reads firstly the analog value of the first memory cell and transfers the analog value to the first half of the data bits of the digital data word and stores this data bits in the I/O register 13. Then the second write/read circuit 12 reads the analog value of the second memory cell, transfers the analog value to the second part of the digital bits of the data word and transmits the digital bits to the I/O register 13. In this process, the second write/read circuit 12 is consecutively clocked by the control circuit 5, whereby the select circuit 8 addresses consecutively the first and the second memory cell for reading the analog data of the first and the second memory cell consecutively by the second write/read circuit 12.

In a further embodiment, the second write circuit 24 comprises a controllable voltage source 41 for charging the memory cell 10 referring to the analog value to a predetermined voltage level representing the analog value.

In a further embodiment, the second read circuit 25 comprises a voltage sensing circuit 42 for sensing the voltage level that is stored in a memory cell.

Figure 4:
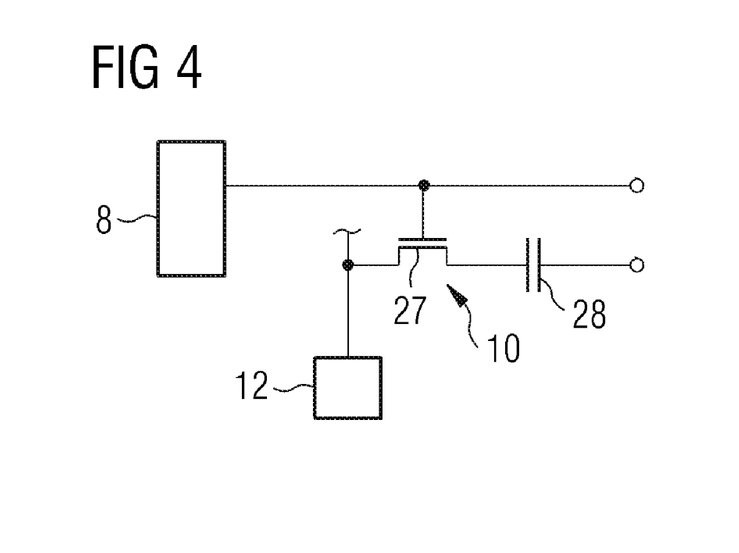
FIG. 4 depicts a DRAM memory as a second embodiment.

FIG. 4 depicts a memory cell 10 that comprises a switch 27 and a memory element 28. The memory element 28 may be a capacitor or a resistive element that may be used for storing an analog value in the memory cell. The switch 27 is controlled by the control circuit 8 and selects the memory cell 10 for reading or storing data from or to the memory cell. In the case of a capacitor as a memory element 28, the second write/read circuit 12 comprises a current source for charging the capacitor to a predetermined electric load representing an analog data. Depending on the analog value that may be stored in the memory cell 10, the second write/read circuit 12 charges the capacitor to a predetermined voltage level that represents the analog value. Additionally, the second write/read circuit 12 comprises, for reading the analog value represented by a voltage level on the capacitor, a voltage sensing unit for detecting the voltage that is stored in the memory cell 10. The detected voltage level is converted by the analog/digital converter 15 to digital data bits or data word.

In the case of a resistive element as a memory element 28 in the memory cell 10, the second write circuit 24 comprises a current or voltage source for adjusting the resistance of the resistive element. Depending on the analog value that is delivered by the digital/analog converter 14 to the second write circuit 24, the second write circuit 24 adjusts the resistance of the resistive element of the memory cell 10 for storing the analog value. For reading the analog value of a programmed resistive memory element, the second read circuit 25 comprises a resistance detecting unit that detects the resistance of the resistive memory element 28 of the memory cell 10. The detected resistance value is delivered to the analog/digital converter 15 that converts the analog resistance value to digital data bits or a data word and passes the digital data bits or the data word to the I/O register 13.

The digital/analog converter 14 and the analog/digital converter 15 comprise converting tables for converting digital data bits or digital data words in at least one analog value and for converting analog values to digital data bits or digital data words.

Figure 5:
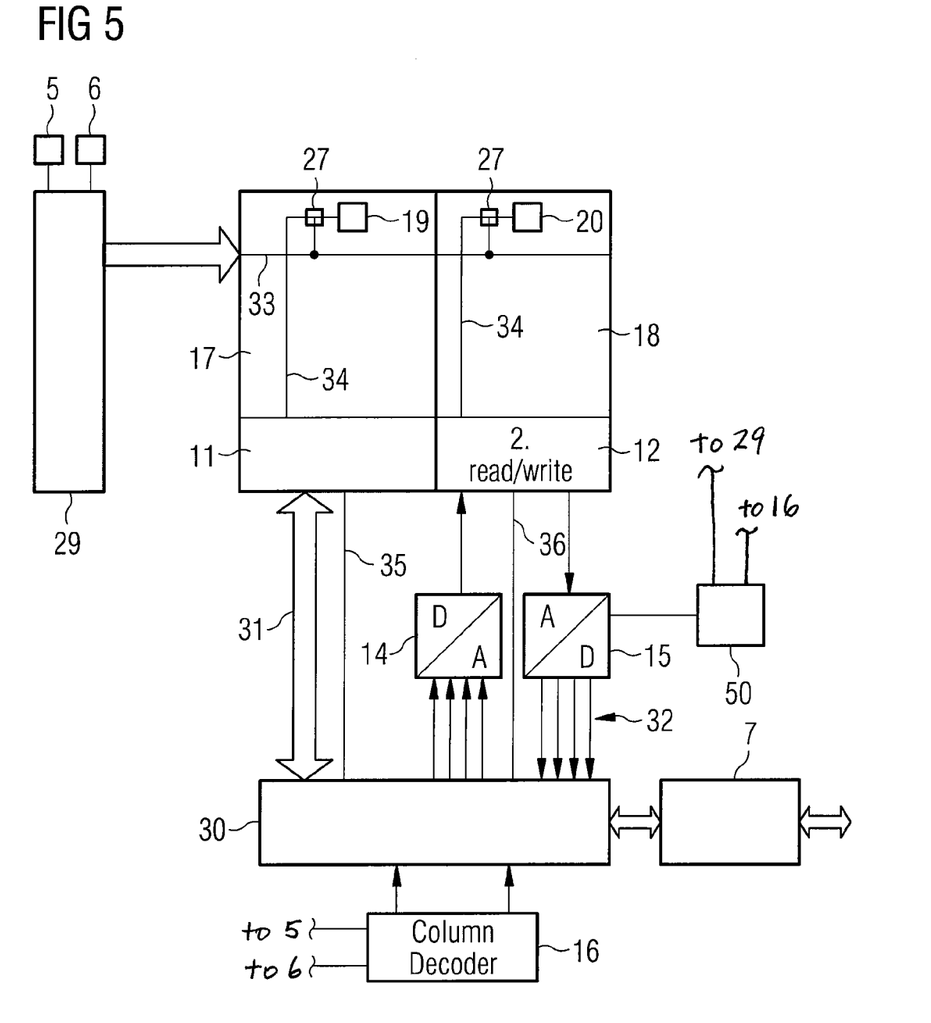
FIG. 5 depicts a third embodiment of the memory circuit.

FIG. 5 depicts a memory circuit that may be configured as a DRAM memory. The memory circuit comprises a row address latch decoder 29 that represents the function of the select circuit and that is connected with word lines 33, wherein the word lines 33 are connected with switches 27 of first and second memory cells 19, 20. The row address latch decoder 29 is connected with the address circuit 6 and the control circuit 5. Furthermore, a column decoder 16 is also connected with the address circuit 6 and the control circuit 5. The column decoder 16 is connected with the first write/read circuit 11 and the second write/read circuit 12 via an input-output unit 30. The input-output unit 30 is connected with the data I/O circuit 7 for receiving and passing data to the first and/or the second write/read circuit 11, 12. Furthermore, the input-output unit 30 is connected directly with the first write/read circuit 11 by a data path 31. The input-output unit 30 is additionally connected with a digital/analog converter 14 and with an analog/digital converter 15 by a second data path 32. The first write/read circuit 11 is connected with bit lines 34 that are disposed in a first array 17 of the memory circuit 2. At crossing points of word lines 33 and bit lines 34 first and second memory cells 19, 20 are disposed, wherein first memory cells 19 are arranged in a first array 17 and second memory cells 20 are arranged in a second array 18 of one cell array.

The A/D converter 15 is connected with the processing circuit 50. The processing circuit 50 is connected with the row address latch decoder 29 and the column decoder 16 receiving the address of the memory cells that are written with data and from which data are written. The processing circuit 50 generates the information regarding how long the read data was stored in the memory cell. Depending on the storage time, the processing circuit 50 determines according to a predetermined time table a correction factor. The processing circuit 50 evaluates the read analog value with the correction factor and generates a corrected analog value. In a further embodiment, the correction factor may be predetermined and based on an average storage time and not calculated individually. In a further embodiment, the processing circuit 50 calculates the storage time using the information at which time the data was stored in the memory cell and at which time the data is read from the memory cell.

The processing circuit 50 converts the corrected analog data to at least two data bits according to a converting table and sends the data bits to the input-output unit 30.

The digital/analog converter 14 and the analog/digital converter 15 are connected with the second write/read circuit 12. The second write/read circuit 12 is connected with bit lines 34 that are disposed in the second array 18 of the cell array. In the second array 18, second memory cells 20 are disposed at crossing points of word lines 33 and bit lines 34. In this embodiment, the second write/read circuit 12 is only connected with second memory cells 20 and the first write/read circuit 11 is only connected with first memory cells 19. The second memory cells 20 may differ from the first memory cells 19 by providing an improved ability to store an analog value. The second memory cells 20 may comprise larger capacitors as memory elements compared to the capacitors of the first memory cells 19.

In another embodiment, the second memory cells 20 may comprise resistive elements as memory elements 21 with a greater adjustable resistance value. Because of the construction of the greater electrical capacity of a second memory cell 20, the storing of an analog value representing a data word with at least two digital data bits may be more precise. The column decoder 16 is connected with the address circuit 6, and the address circuit 6 delivers the addresses of the bit lines that has to be sensed for reading or storing data to or from selected first or second cells 19, 20. Thus, the column decoder 16 is connected, via I/O unit 30, with selecting lines 35, 36 to the first write/read circuit 11 and to the second write/read circuit 12 to select individually bit lines 34 for reading and writing operation with selected first and/or second memory cells 19, 20. The reading and writing operation in the embodiment of FIG. 5 operates in an analog method as described above.

Figure 6:
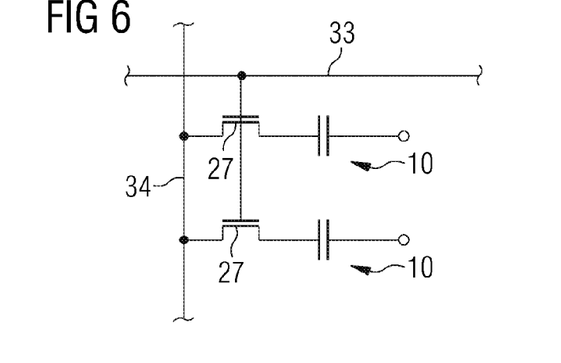
FIG. 6 depicts an arrangement with two memory cells in parallel.

FIG. 6 depicts a detailed part of a further embodiment that shows a parallel arrangement of two memory cells 10 that may be controlled by one word line 33 and connected with one bit line 34. By using two memory cells 10, the capacitor for storing an analog value is doubled, and therefore, an increased accuracy may be attained by using two or more memory cells in parallel for storing the analog value representing at least two data bits.

In the embodiment of FIG. 6, the two switches 27 of the memory cells 10 are connected together and connected with one word line. Therefore, the two memory cells may be addressed by selecting the one word line and the one bit line.

In another embodiment, two memory cells that are controlled by two word lines may be selected and activated at the same time, and the data may be read or written by the one bit line that is connected with the two memory cells 10 for storing one analog value in at least two parallel operated memory cells 10 or for reading one analog value from the at least two memory cells 10.

In a further embodiment, a refresh mechanism with a read operation and with an additionally write operation may be used for refreshing the capacity of the memory cells to avoid corruption of the data and to ensure acceptable accuracy by a leakage of the capacitor. In this embodiment, the refresh cycle time of memory cells that are used for storing an analog data may be different to the refresh cycle time of other memory cells that may be used for storing a digital data.

Figure 7:
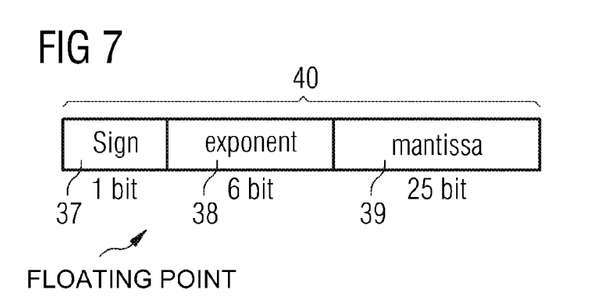
FIG. 7 depicts a digital data word.

FIG. 7 depicts a schematic view of a data word 40 representing a floating point pixel information comprising a sign, an exponent and a mantissa. The sign 37 may comprise one data bit; the exponent 38 may comprise 6 data bits; and the mantissa 39 may comprise 25 data bits. In a further embodiment, the mantissa 39 may be split from the exponent, if necessary, to get a normalization of the stored analog value. Furthermore, the mantissa 39 may be stored as an analog value, and the exponent 38 may be stored as digital data. Thus, the digital data word 40 comprising digital data bits for the mantissa and digital data bits for the data word may be stored as an analog value and as digital values.

Figure 8:
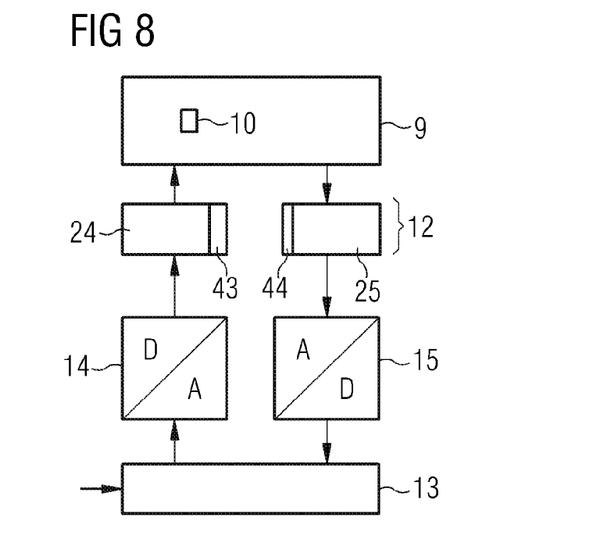
FIG. 8 depicts a further embodiment of a writing/reading circuit.

FIG. 8 depicts a further embodiment of the second write/read circuit 12, wherein the second write circuit 24 comprises a resistance modification circuit 43 and the second read circuit comprises a resistance sensing circuit 44. The controllable resistance modification circuit 43 is used for adjusting the analog resistance of a resistive element of a memory cell according to the analog value that is to be stored in the memory cell. The resistance sensing circuit 44 is used for sensing the analog resistance value that is stored in the resistive element of a memory cell.

While the foregoing is directed to embodiments of the present invention, other and further embodiments of the invention may be devised without departing from the basic scope thereof, and the scope thereof is determined by the claims that follow.

What is claimed is:

1. A memory circuit, comprising:
    a memory controller having an input/output circuit connected to a memory array having a plurality of memory cells;
    an address circuit configured to select at least one of the memory cells for a reading or a writing operation;
    a reading circuit and a writing circuit connected with the input/output circuit, wherein the writing circuit stores digital data in the selected at least one memory cell and the reading circuit reads digital data from the selected at least one memory cell;
    a digital-to-analog (D/A) converter connected with the input/output circuit and with the writing circuit, wherein the D/A converter converts a digital data with at least two digital bits received from the input/output circuit to one analog value and forwards the analog value to the writing circuit, wherein the digital data is at least a part of a floating point number, and wherein the writing circuit writes the analog value in the selected at least one memory cell; and
    an analog-to-digital (A/D) converter connected with the reading circuit and with the input/output circuit, wherein the reading circuit reads an analog value from the selected at least one memory cell and forwards the analog value to the A/D converter, wherein the A/D converter converts the analog value to digital data, and wherein the A/D converter forwards the digital data to the input/output circuit.

2. The memory circuit of claim 1, wherein the reading circuit comprises a voltage sensing circuit for sensing the analog value of the selected memory cell, wherein the reading circuit comprises a processing circuit configured to process the sensed analog value to a corrected analog value.

3. The memory circuit of claim 1, wherein the reading circuit comprises a sensing circuit for sensing the analog value of the memory cell, wherein the reading circuit comprises a processing circuit configured to process the sensed analog value to a corrected analog value depending on a storage time period during which the analog value was stored into the memory cell.

4. The memory circuit of claim 3, wherein the processing circuit increases the sensed analog value proportional to the storage time period for storing the analog value into the memory cell.

5. The memory circuit of claim 3, wherein the processing circuit evaluates the sensed analog value with respect to a predetermined coefficient that represents an average storage time.

6. The memory circuit of claim 1, wherein the memory cell comprises a capacitor for storing data and wherein the analog value represents at least two digital data bits.

7. The memory circuit of claim 1, wherein the memory cell comprises a resistive element with an adjustable resistance and wherein the analog value is stored in the memory cell as an analog resistance value of the resistive element.

8. The memory circuit of claim 7, wherein the writing circuit comprises a controllable modification circuit configured to adjust the analog resistance value of the resistive element corresponding to the analog value.

9. The memory of circuit claim 8, whereby the reading circuit comprises a resistance value sensing circuit configured to determine the analog resistance value of the resistive element of the memory cell.

10. The memory of circuit claim 1, wherein the floating point number represents a graphic information that is used for displaying a picture on a display.

11. The memory circuit of claim 1, wherein the memory comprises a further writing circuit and a further reading circuit, for writing and reading, respectively, digital data as a digital value to or from the plurality of memory cells.

12. The memory circuit of claim 11, wherein the writing circuit and the reading circuit are connected with a first type of memory cells, and wherein the further writing circuit and the further reading circuit are connected with a second type of memory cells.

13. The memory circuit of claim 12, wherein the type utilized for storing analog information has a larger capacity than the other type.

14. The memory circuit of claim 12, wherein digital information and analog information are stored in different types of memory cells.

15. The memory circuit of claim 1, wherein the writing circuit is configured to write the analog value in two memory cells in parallel and wherein the reading circuit is configured to read the analog values from the two memory cells in parallel.

16. The memory circuit of claim 1, wherein a mantissa part of the floating point number is stored as the analog value.

17. The memory circuit of claim 16, wherein an exponent of the floating point number is stored as a digital value.

18. A dynamic random access memory (DRAM) circuit, comprising:
  a memory controller having an input/output circuit connected with a memory array having a plurality of memory cells;
  an address circuit configured to select at least one of the memory cells;
  a reading circuit and a writing circuit connected with the input/output circuit, wherein the writing circuit stores digital data in the selected at least one memory cell and the reading circuit reads data from the selected at least one memory cell;
  a digital-to-analog (D/A) converter connected via the input/output circuit with the writing circuit, wherein the D/A converter converts a digital data with at least two digital bits received from the input/output circuit, to one analog value and forwards the analog value to the writing circuit, wherein the digital data represent at least a part of a floating point number, wherein the writing circuit writes the analog value in the selected at least one memory cell; and
  an analog-to-digital (A/D) converter connected with the reading circuit and with the input/output circuit, wherein the reading circuit reads an analog value from the selected at least one memory cell and forwards the analog value to the A/D converter, wherein the A/D converter converts the analog value to digital data, wherein the A/D converter forwards the digital data to the input/output circuit.

19. The DRAM circuit of claim 18, further comprising a processing circuit configured to process the sensed analog value to a corrected analog value.

20. The DRAM circuit of claim 19, wherein the processing circuit is configured to process the sensed analog value to a corrected analog value depending on a time during which the analog value was stored.

21. The DRAM circuit of claim 19, wherein the processing circuit increases the sensed analog value proportionally to a storage time period for storing the analog value.

22. The DRAM circuit of claim 19, wherein the processing circuit evaluates the sensed analog value with respect to a predetermined coefficient that represents an average storage time.

23. The DRAM circuit of claim 18, further comprising a further read/write circuit for writing and reading digital data as digital values to or from memory cells.

24. The DRAM circuit of claim 23, wherein the writing circuit and the reading circuit are connected with a first type of memory cells, and wherein the further read/write circuit is connected with a second type of memory cells.

25. The DRAM circuit of claim 24, and wherein the type utilized for storing analog information has a larger capacity than the other type.

26. The DRAM circuit of claim 24, wherein the digital information and the analog information are stored in different types of memory cells.

27. A memory with memory cells, the memory comprising:
  an address circuit for selecting a memory cell;
  a writing circuit and a reading circuit, wherein the writing circuit receives digital data from an input/output circuit and writes one digital bit of the digital data in a selected memory cell, wherein the reading circuit reads a digital bit from a selected memory cell and forwards the digital bit to the input/output circuit, wherein the digital data represents at least a part of a floating point number;
  an analog-to-digital (A/D) converter for converting the digital data with at least two digital bits to an analog value, wherein the writing circuit writes the analog value in one selected memory cell, wherein the reading circuit reads the analog value from one selected memory cell and the A/D converter converts the analog value from the reading circuit to the digital data with at least two digital bits that are forwarded to the input/output, wherein the reading circuit comprises a voltage sensing circuit for sensing the voltage level of the memory cell that represents an analog value for at least a part of a floating point number; and
  a processing circuit for processing the sensed voltage to a corrected voltage level depending on a time during which the analog data was stored.

* * * * *